United States Patent
Wu et al.

(10) Patent No.: US 10,651,613 B2
(45) Date of Patent: May 12, 2020

(54) PLUG CONNECTOR ASSEMBLY AND MANUFACTURING METHOD OF THE SAME

(71) Applicant: FOXCONN INTERCONNECT TECHNOLOGY LIMITED, Grand Cayman (KY)

(72) Inventors: Jerry Wu, Irvine, CA (US); Jun Chen, Kunshan (CN); Fan-Bo Meng, Kunshan (CN)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/100,591

(22) Filed: Aug. 10, 2018

(65) Prior Publication Data

US 2019/0052032 A1 Feb. 14, 2019

(30) Foreign Application Priority Data

Aug. 10, 2017 (CN) .......................... 2017 1 0681102

(51) Int. Cl.
*H01R 24/60* (2011.01)
*H01R 12/72* (2011.01)
(Continued)

(52) U.S. Cl.
CPC .............. *H01R 24/60* (2013.01); *H01R 4/02* (2013.01); *H01R 12/724* (2013.01); *H01R 12/725* (2013.01); *H01R 13/6591* (2013.01); *H05K 1/111* (2013.01); *H05K 1/117* (2013.01); *H01R 9/0515* (2013.01); *H01R 12/592* (2013.01); *H01R 12/596* (2013.01);
(Continued)

(58) Field of Classification Search
CPC .... H01R 13/6466; H01R 24/64; H01R 24/00; H01R 24/60; H01R 24/62; H01R 13/6593; H01R 13/6592; H01R 9/0515; H01R 24/50; H01R 12/775; H01R 12/596; H01R 12/592
USPC ..... 439/660, 676, 607.41, 607.47, 494, 497, 439/581
See application file for complete search history.

(56) References Cited

U.S. PATENT DOCUMENTS

| 2009/0104813 | A1 | 4/2009 | Chen |
| 2016/0079689 | A1* | 3/2016 | Wu ...................... B23K 1/0016 439/581 |
| 2018/0261956 | A1* | 9/2018 | Yamaguchi ............ H01R 4/027 |

\* cited by examiner

*Primary Examiner* — Abdullah A Riyami
*Assistant Examiner* — Justin M Kratt
(74) *Attorney, Agent, or Firm* — Wei Te Chung; Ming Chieh Chang

(57) ABSTRACT

A plug connector assembly includes a housing, a printed circuit board, a cable, and a wire management block, the printed circuit board including first conductive pads and second conductive pads, the cable including plural first core wires and second core wires, the first core wire including a first inner conductor and a shielding layer, the second core wire including a second inner conductor, wherein the wire management block is provided with a plurality of clamping slots, the second core wire is clamped in the clamping slot and exposes the second inner conductor to the front side of the wire management block, the first inner conductors are arranged in a row and soldered to the first conductive pads at one time, the second inner conductors and the shielding layers are arranged in a row and soldered to the second conductive pads of the printed circuit board at one time.

16 Claims, 11 Drawing Sheets

(51) Int. Cl.
H05K 1/11 (2006.01)
H01R 4/02 (2006.01)
H01R 13/6591 (2011.01)
*H01R 13/58* (2006.01)
*H01R 107/00* (2006.01)
*H01R 13/6592* (2011.01)
*H01R 24/00* (2011.01)
*H01R 12/59* (2011.01)
*H01R 24/64* (2011.01)
*H01R 24/62* (2011.01)
*H01R 24/50* (2011.01)
*H01R 13/6593* (2011.01)
*H01R 12/77* (2011.01)
*H01R 9/05* (2006.01)

(52) U.S. Cl.
CPC ........ *H01R 12/775* (2013.01); *H01R 13/5804* (2013.01); *H01R 13/6592* (2013.01); *H01R 13/6593* (2013.01); *H01R 24/00* (2013.01); *H01R 24/50* (2013.01); *H01R 24/62* (2013.01); *H01R 24/64* (2013.01); *H01R 2107/00* (2013.01); *H05K 2201/09409* (2013.01); *H05K 2201/10189* (2013.01)

PLUG CONNECTOR ASSEMBLY AND MANUFACTURING METHOD OF THE SAME

BACKGROUND OF THE INVENTION

1. Field of the Invention

The present invention relates generally to a plug connector assembly and manufacturing method of the same, and more particularly to a plug connector assembly with the structure of a wire management block and the solder method of a cable and printed circuit board.

2. Description of Related Arts

China Patent Application Publication No. 105702327, published on Jun. 22, 2016, discloses a cable connector assembly. The cable connector assembly includes two holders for fixing core wires and a printed circuit board connected between a cable and a connector. The two holders are assembled together in an up and down direction for securing the exposed core wires to facilitate soldering of the core wires to the printed circuit board. The core wires include a ground wire and a plurality of signal core wires. The ground core wire and signal core wires are fixed together in holes provided by the holders. The holders of the cable connector assembly fix the position of all the cable core wires at one time. Separate processing of these core wires is difficult to do.

An improved plug connector assembly is desired.

SUMMARY OF THE INVENTION

An object of the present invention is to provide a plug connector assembly with a wire management block which has different positioning methods for different core wires.

To achieve the above-mentioned object, a plug connector assembly includes a housing, a printed circuit board, a cable, and a wire management block, the printed circuit board including first conductive pads and second conductive pads, the cable including plural first core wires and second core wires, the first core wire including a first inner conductor and a shielding layer, the second core wire including a second inner conductor, wherein the wire management block is provided with a plurality of clamping slots, the second core wire is clamped in the clamping slot and exposes the second inner conductor to the front side of the wire management block, the first inner conductors of the first core wires are arranged in a row and soldered to the first conductive pads of the printed circuit board at one time, the second inner conductors of the second core wires and the shielding layers of the first core wires are arranged in a row and soldered to the second conductive pads of the printed circuit board at one time.

DETAILED DESCRIPTION OF THE PREFERRED EMBODIMENT

Figure 1:
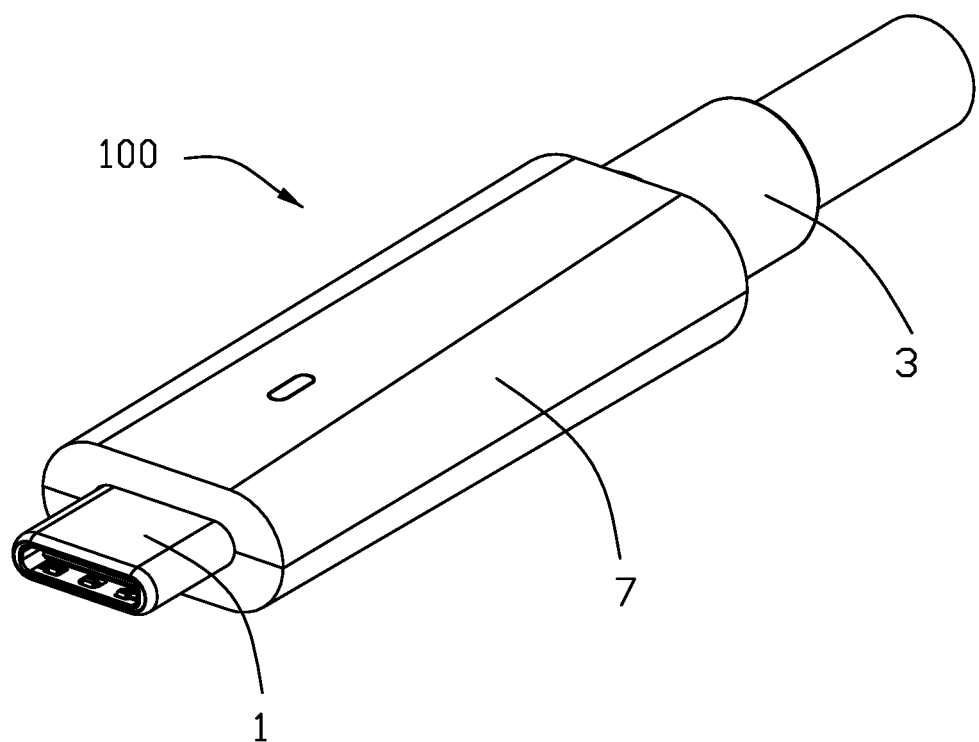
FIG. 1 is a perspective view of a plug connector assembly in the present invention.
Figure 2:
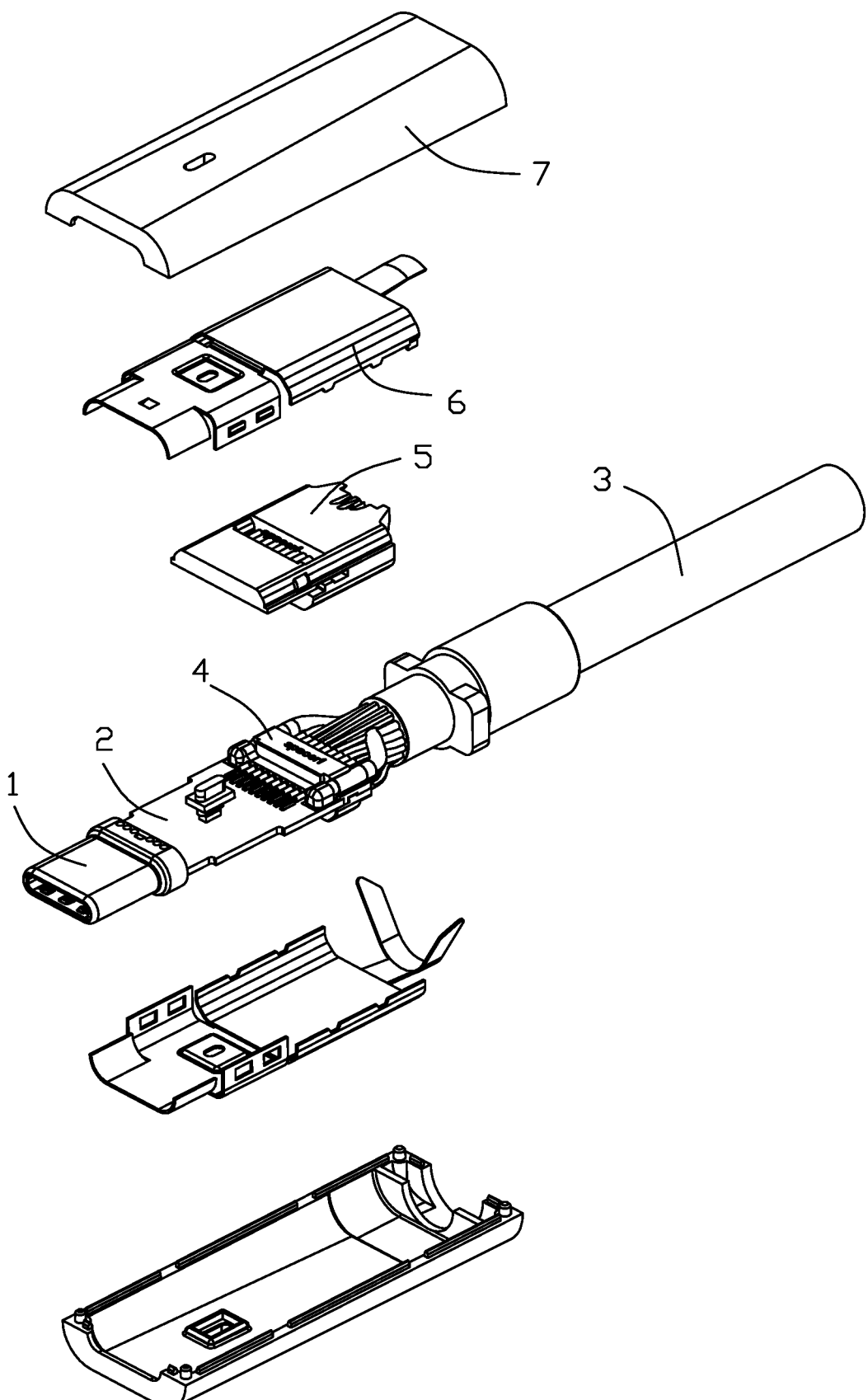
FIG. 2 is an exploded view of the plug connector assembly as shown in FIG. 1.
Figure 3:
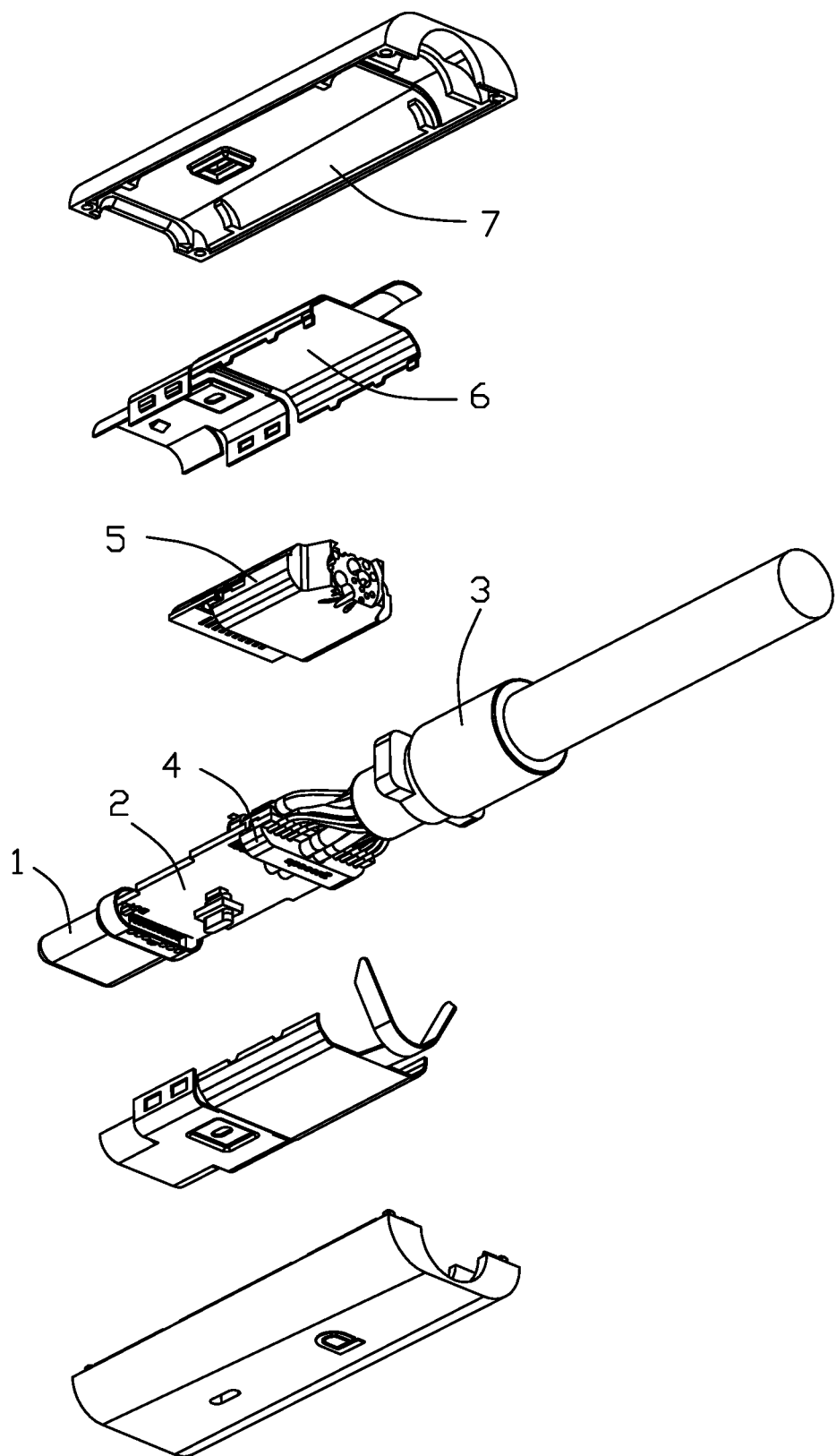
FIG. 3 is an another exploded view of the plug connector assembly as shown in FIG. 2.

Referring to FIGS. 1 to 11, a plug connector assembly in the present invention includes a plug 1, a printed circuit board 2 electrically connected with the plug 1, a cable 3 electrically connected with the printed circuit board 2, a wire management block 4 fixed on one end of the cable 3 that is connected to the printed circuit board 2, an inner mold 5 formed at a junction of the printed circuit board 2 and the cable 3, a metal shield shell 6 covering the junction of the printed circuit board 2 and the plug 1, the printed circuit board 2, and the inner mold 5, and an insulative shell 7 covering on an outside of the metal shield shell 6.

Figure 4:
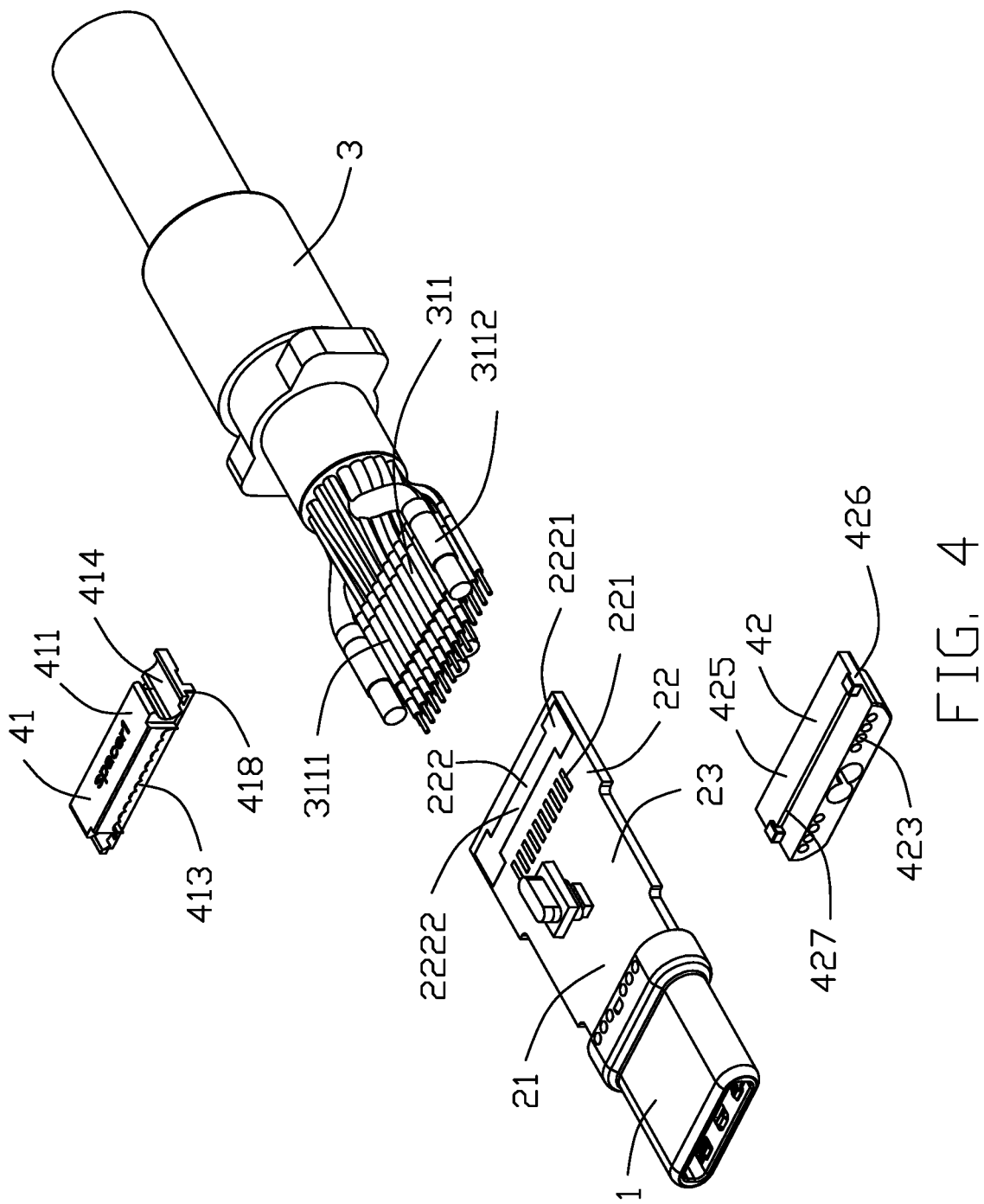
FIG. 4 is a partly exploded view of a plug, a printed circuit board, a cable and a wire management block of the plug connector assembly as shown in FIG. 1.

Referring to FIG. 4, the printed circuit board 2 includes a first end 21 electrically connected with the plug 1, a second end 22 electrically connected with the cable 3, a middle portion 23 connected between the first end 21 and second end 22. The top surface of the second end 22 is provided with a plurality of laterally spaced rectangular first conductive pads 221 and one or more second conductive pads 222 disposed on the rear side of the first conductive pads 221. The second conductive pad 222, in the case of only one pad as shown, extends in a lateral direction and have has a lateral width greater than a lateral distribution span of the first conductive pads 221. The second conductive pad 222 includes two grounding portions 2221 located on two sides and a connecting portion 2222 connected between the two grounding portions 2221.

Figure 6:
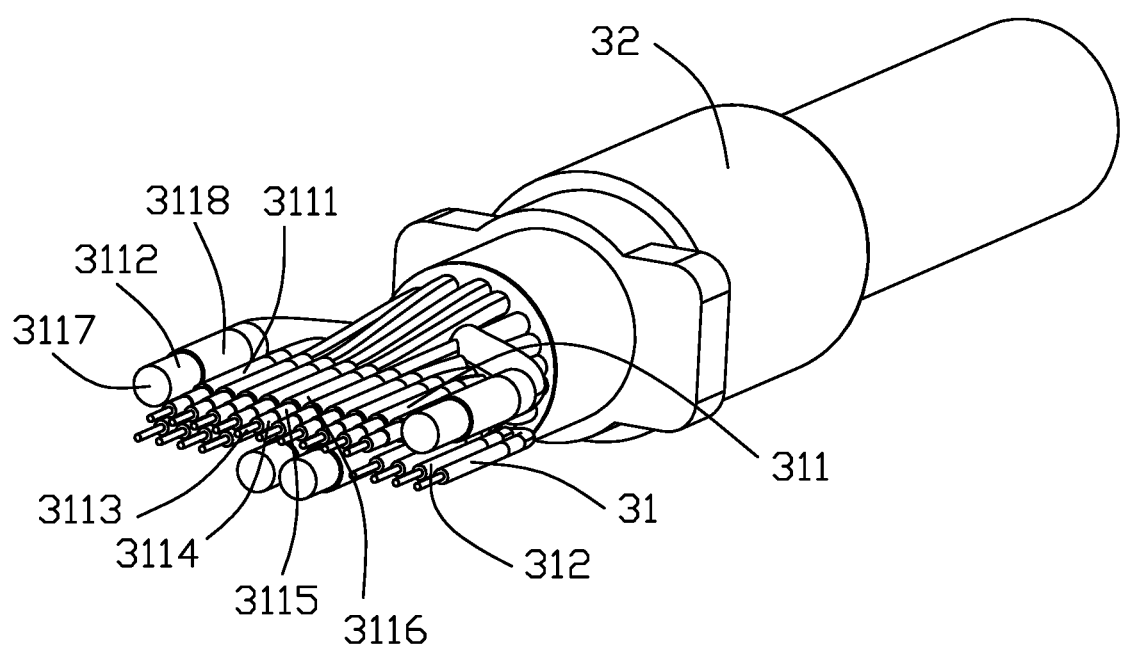
FIG. 6 is an enlarged view of the cable of the plug connector assembly as shown in FIG. 4.
Figure 7:
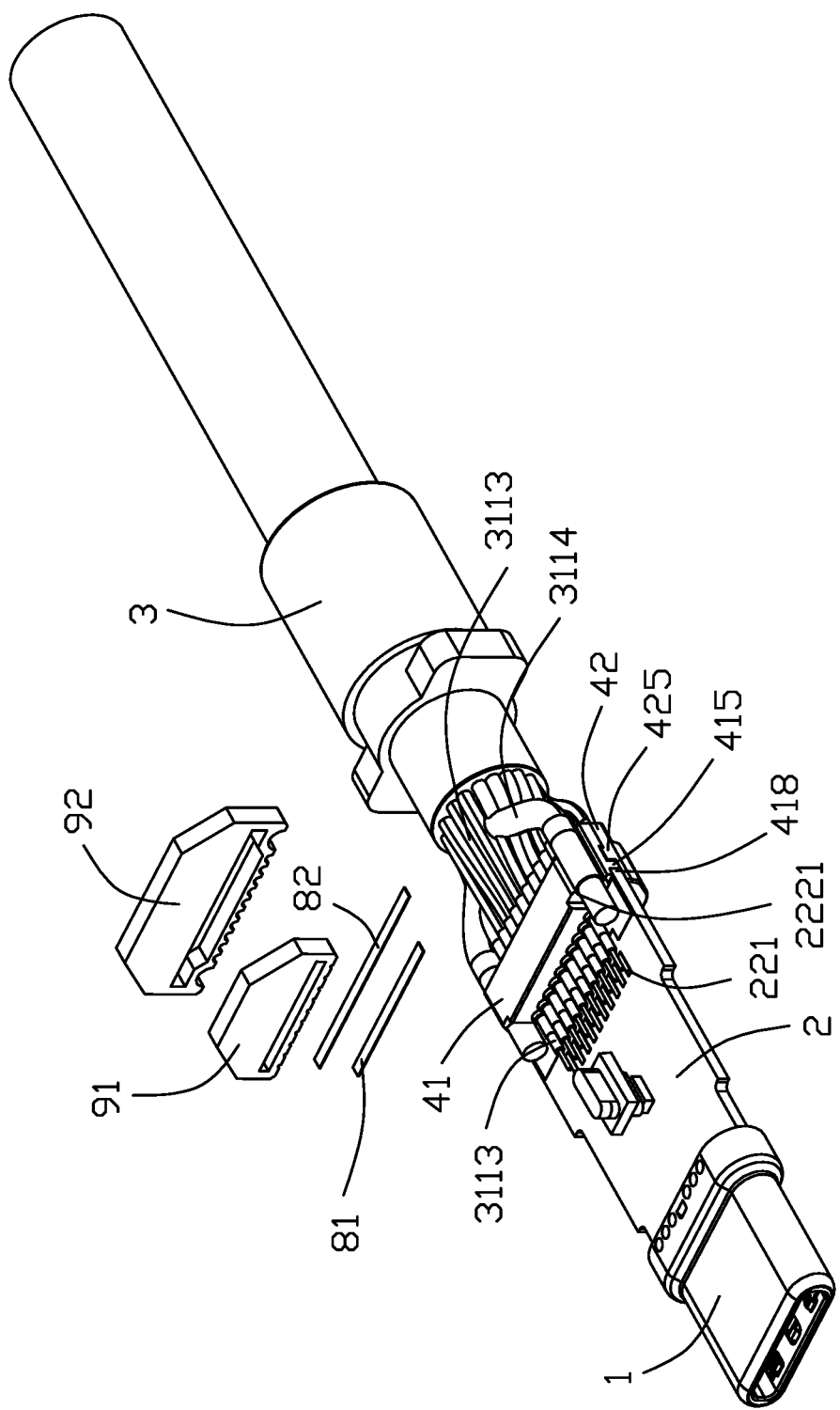
FIG. 7 is an exploded view of the assembly structure of the plug connector assembly with a first welding rod, a second welding rod, a first thermal pad and a second thermal pad as shown in FIG. 4.
Figure 8:
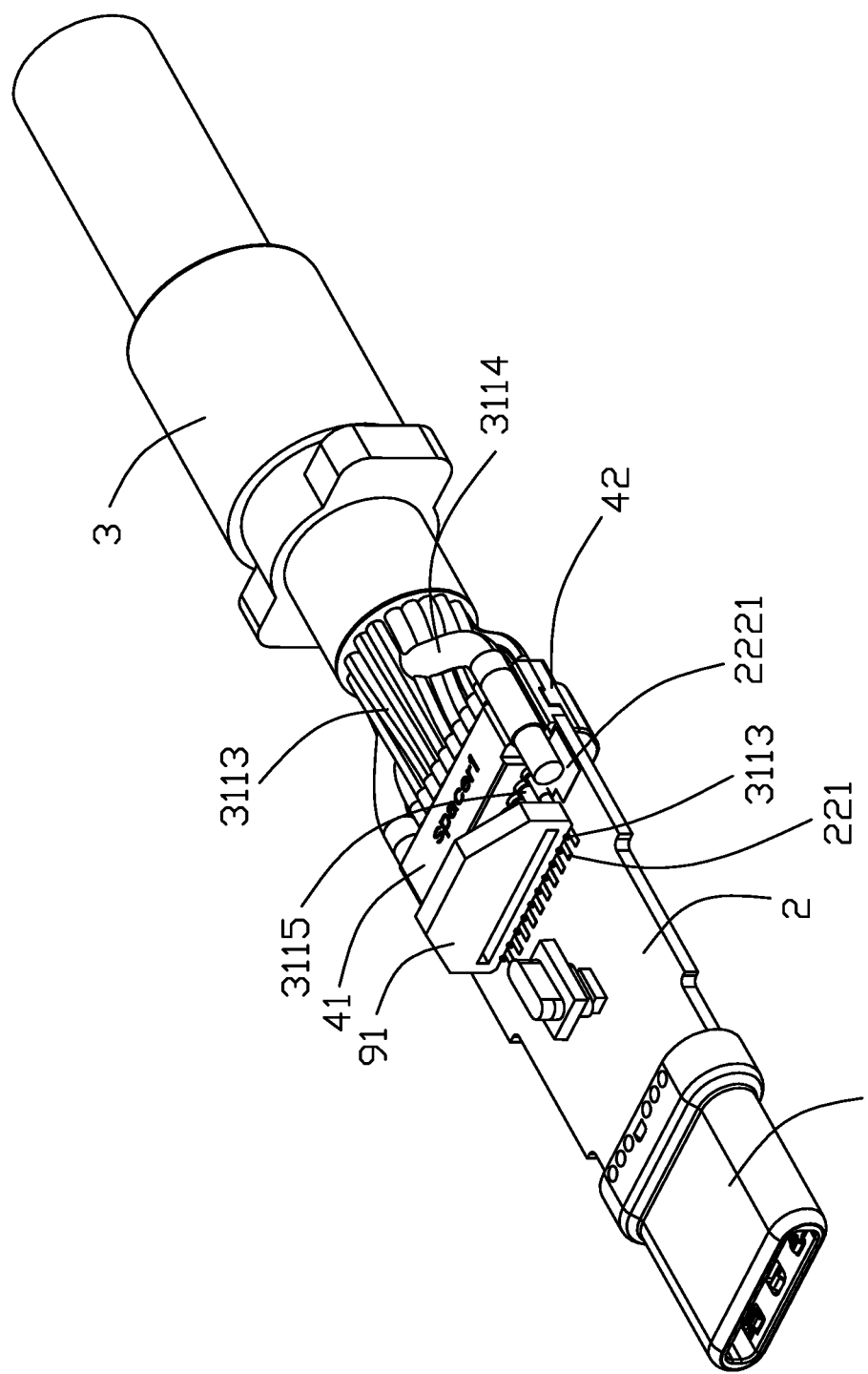
FIG. 8 is a perspective view of the assembly structure of the plug connector assembly when welded by the first thermal pad as shown in FIG. 4.
Figure 9:
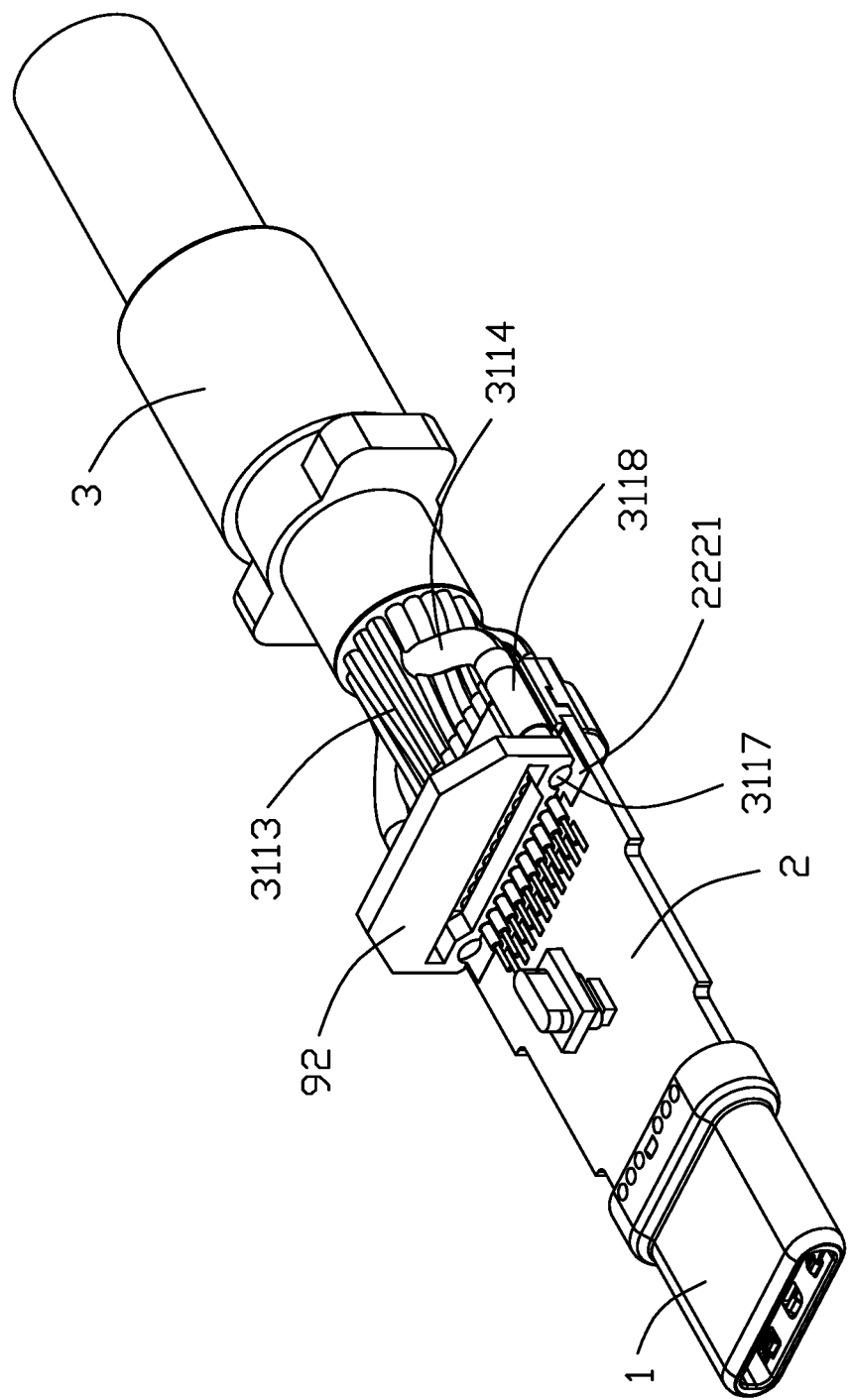
FIG. 9 is a perspective view of the assembly structure of the plug connector assembly when welded by the second thermal pad as shown in FIG. 4.

Referring to FIG. 6, the cable 3 includes a plurality of core wires 31 and an insulative outer cover 32 covering the outside of the core wires 31. The core wires 31 include a plurality of upper row of core wires 311 extending in the front and rear direction and arranged horizontally in the transverse, and a plurality of lower row of core wires 312 vertically opposed to the upper row of core wires 311. The upper row of core wires 311 include a plurality of high-speed signal core wires 3111 arranged in the middle position and two ground core wires 3112 respectively located on opposite sides of the high speed signal core wires 3111. Each of high-speed signal core wires 3111 include an inner conductor 3113, an inner insulating layer 3114 wrapped around the inner conductor 3113, a metal braid layer 3115 wrapped around the inner insulating layer 3114 and a outer insulation 3116 wrapped around the metal braid layer 3115. The ground core wires 3112 include ground conductor 3117 and ground insulation 3118 wrapped around the ground conductor 3117.

Figure 5:
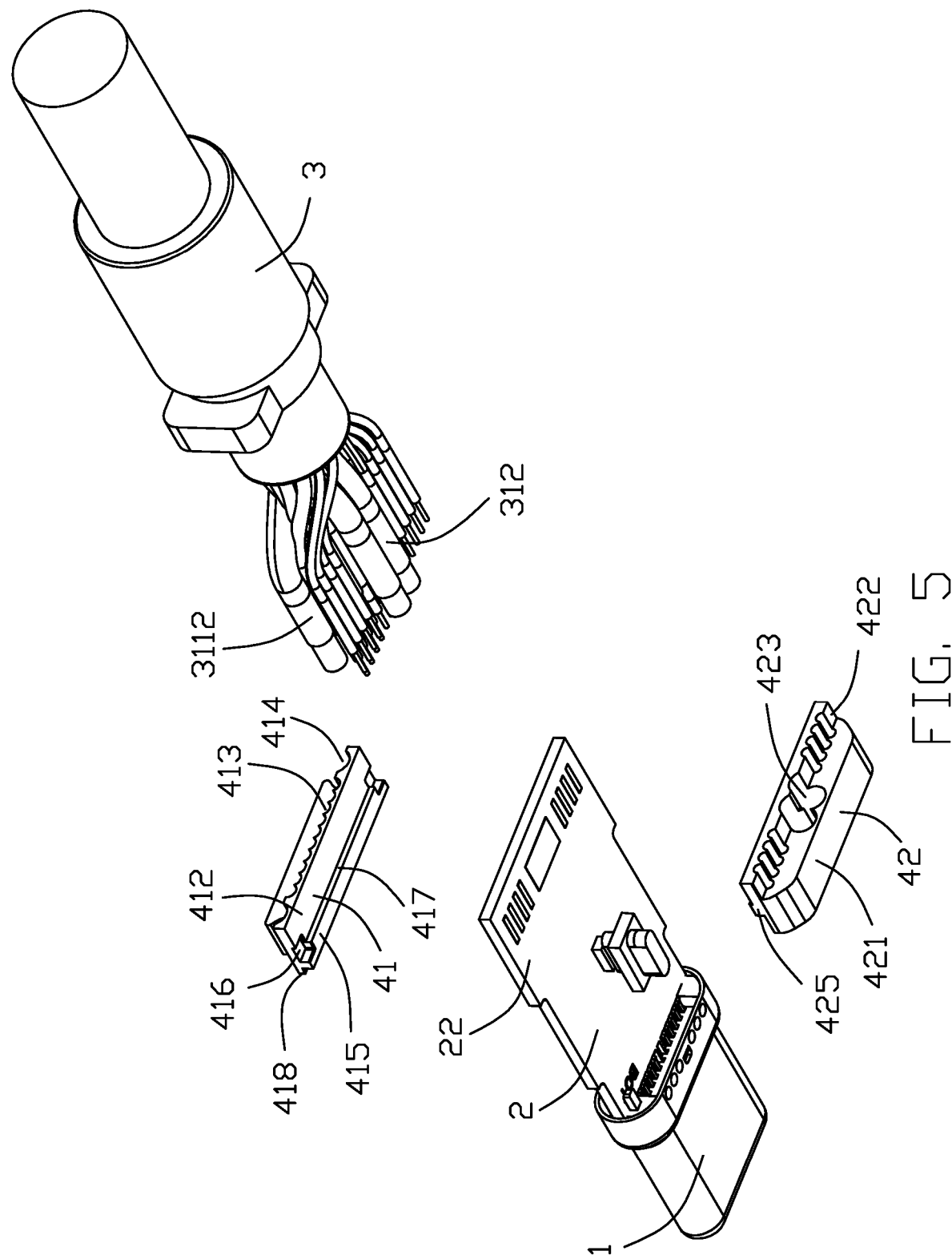
FIG. 5 is an another partly exploded view of a plug, a printed circuit board, a cable and a wire management block of the plug connector assembly as shown in FIG. 4.

Referring to FIGS. 4 to 5, the block 4 includes a first portion 41 and a second portion 42 that are fastened to each other. The first portion 41 has first fixing holes 413 through which the upper row of core wires 311 of the cable 3 are allowed to pass through. A rear portion of the first fixing hole 413 extends upward through a top surface of the extending portion 412 to form an arcuate groove shape. The two first fixing holes 413 of the first fixing holes 413 corresponding to the ground core wires 3112 of the upper row of core wires 311 on both sides are essentially the open type clamping slots 414. The entire clamping slot 414 extends through the top surfaces of the body portion 411 and the extension portion 412 such that the clamping slot 414 presents an arcuate clamping slot having an opening on one side in order to place the ground core wire 3112 therein along a direction substantially perpendicular to the front-to-back direction. The second portion 42 includes a body portion 421 and a plate-like extending portion 422 extending rearward from a rear end portion of the body portion 421. The second portion 42 defines a plurality of second fixing holes 423 through which the lower row of core wires 312 of the cable 3 are allowed to pass through from the front to the rear. The bottom side of the first portion 41 extends downward to form a strip-shaped first positioning strip 415. The first step portion 417 is formed between the first positioning strip 415 and a rear end portion of the bottom side of the first portion 41. The third step portion 418 is formed between the first positioning strip 415 and a front end portion of the bottom side of the first portion 41. The first portion 41 is respectively recessed with fixing grooves 416 at two ends of the first step portion 417. The rear end portion of the top side of the second portion 42 extends upward to form a strip-shaped second positioning strip 425. The second step portion 427 is formed between the second positioning bar 425 and the front end portion of the top side of the second portion 42. The second portion 42 protrudes from the two ends of the second step portion 427 respectively. When the first portion 41 is engaged with the second portion 42, the first step portion 417 of the first portion 41 and the second step portion 427 are engaged with each other in the front-rear direction, the fixing post 426 is interposed into the corresponding fixing groove 416, thereby achieving the first portion 41 and the second portion 42 being locked to each other. The thickness of the first positioning bar 415 and the second positioning bar 425 in the up and down direction is equal to the thickness of the printed circuit board 2. After the first portion 41 and the second portion 42 are buckled with each other, the top side of the main body portion 421 of the second portion 42 and the front end of the first portion 41 form a stepped positioning portion (not labeled) for positioning the back end of the printed circuit board 2.

Refer to FIGS. 7 to 10 for assembling of the printed circuit board 2, the cable 3, and the wire management block 4 of the plug connector assembly 100. First, the outer insulating layer 3116 of the high-speed signal core 3111 of the upper row of core wires 311 is peeled off to expose the metal braid layer 3115 thereof, and the metal braid layer 3115 is tinned to facilitate subsequent cutting of the metal braid layer 3115; cutting the metal braid 3115 to expose the inner insulating layer 3114; continue to cut the inner insulating layer 3114 to expose the inner conductor 3113, and dip the exposed inner conductor 3113, the length of the exposed inner conductor 3113 of the high speed signal core 3111 remains the same, the length of the exposed and retained inner insulating layer 3114 remains the same, the length of the metal braid 3115 that is exposed and retained remains the same; then, the stripped high-speed signal core wire 3111 is passed through the first fixing hole 413 corresponding to the first portion 41 of the wire management block 4, and maintaining the front end alignment of the high-speed signal core 3111 to keep the length of the high-speed signal core 3111 exposed to the front end of the wire management block 4 to be consistent to achieve the side-by-side fixing of the upper core 311; cutting the ground insulating layer 3118 of the grounding core 3112 of the upper row of core wires 311 to expose the grounding conductor 3117 and perform soldering, and the grounding core wire 3112 is pressed in from the top side of the clamping slot 414 of the wire management block 4 to be inserted into the clamping slot 414, while maintaining the front end of the exposed ground conductor 3117 aligned with the front end of the exposed metal braid 3115; the rear end of the printed circuit board 2 is snapped into the third step portion 418 and placed on the top side of the front end of the main body portion 421 of the second portion 42 to position the printed circuit board 2, at the same time, the fully tinned inner conductor 3113 of the high speed signal core 3111 is placed on the corresponding first conductive pad 221 of the printed circuit board 2, place the tinned metal braid layer 3115 of the high speed signal core 3111 on the connecting portion 2222, place the tinned grounding conductor 3117 of the grounding core 3112 on the corresponding grounding portion 2221, since the inner conductor 3113, the metal braid layer 3115 and the ground conductor 3117 are both subjected to tinning treatment in advance, the tin is facilitated to be pre-fixed with the corresponding conductive pad; a first tin/soldering strip 81 having a length conforming to the left-right direction span of the high-speed signal core 3111 and having a width conforming to the exposed length of the inner conductor 3113 is used and placed in the left-right direction on the top side of the inner conductor 3113, a first hot plate 91 having a plurality of arcuate grooves conforming to the peripheral arc of the inner conductor 3113 is used, and an arcuate groove is placed on the first tin bar 81 corresponding to each inner conductor 3113, heating the first hot plate 91 to heat and further divide the first tin strip 81 into respective pieces for respectively soldering the inner conductor 3113 to the corresponding first conductive pad 221; a second tin/soldering strip 82 having a length conforming to the left-right direction span of the upper row of core wires 311 and having a width conforming to the exposed length of the metal braid layer 3115 is used and placed in the left-right direction on the top side of the metal braid layer 3115 and the ground conductor 3117; a second hot plate 92 having a plurality of arcuate grooves conforming to the outer arc of the metal braid 3115 and the ground conductor 3117 is used, and the arcuate groove is placed in the second corresponding to the corresponding metal braid 3315 and the ground conductor 3117 on the tin bar 82, the second hot plate 92 is heated to heat the second tin strip 82 and the metal braid 3115 is welded to the connecting portion 2222, the ground conductor 3117, and the ground portion 2221.

Figure 10:
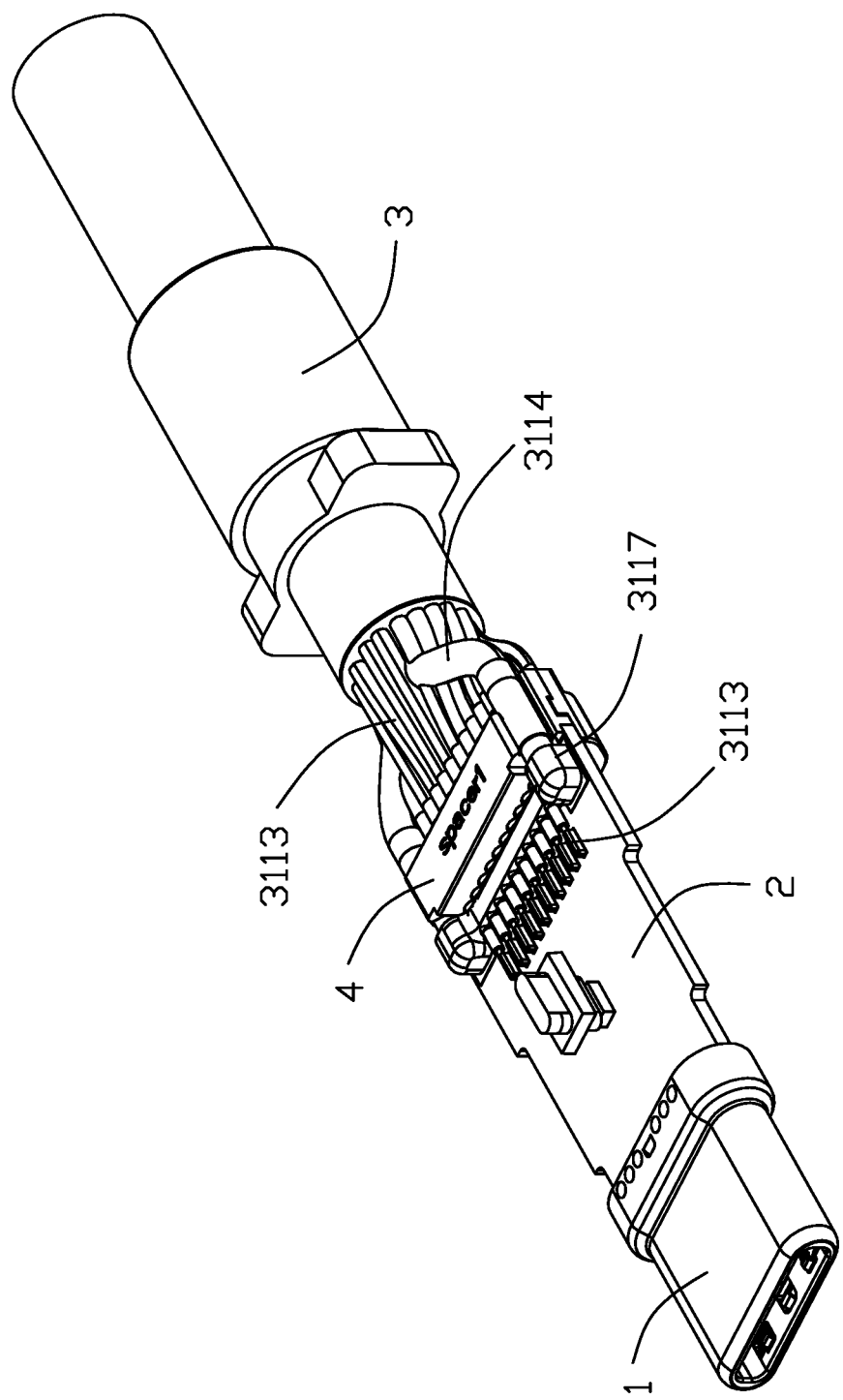
FIG. 10 is a perspective view of the assembly structure of the plug connector assembly when welded as shown in FIG. 4.
Figure 11:
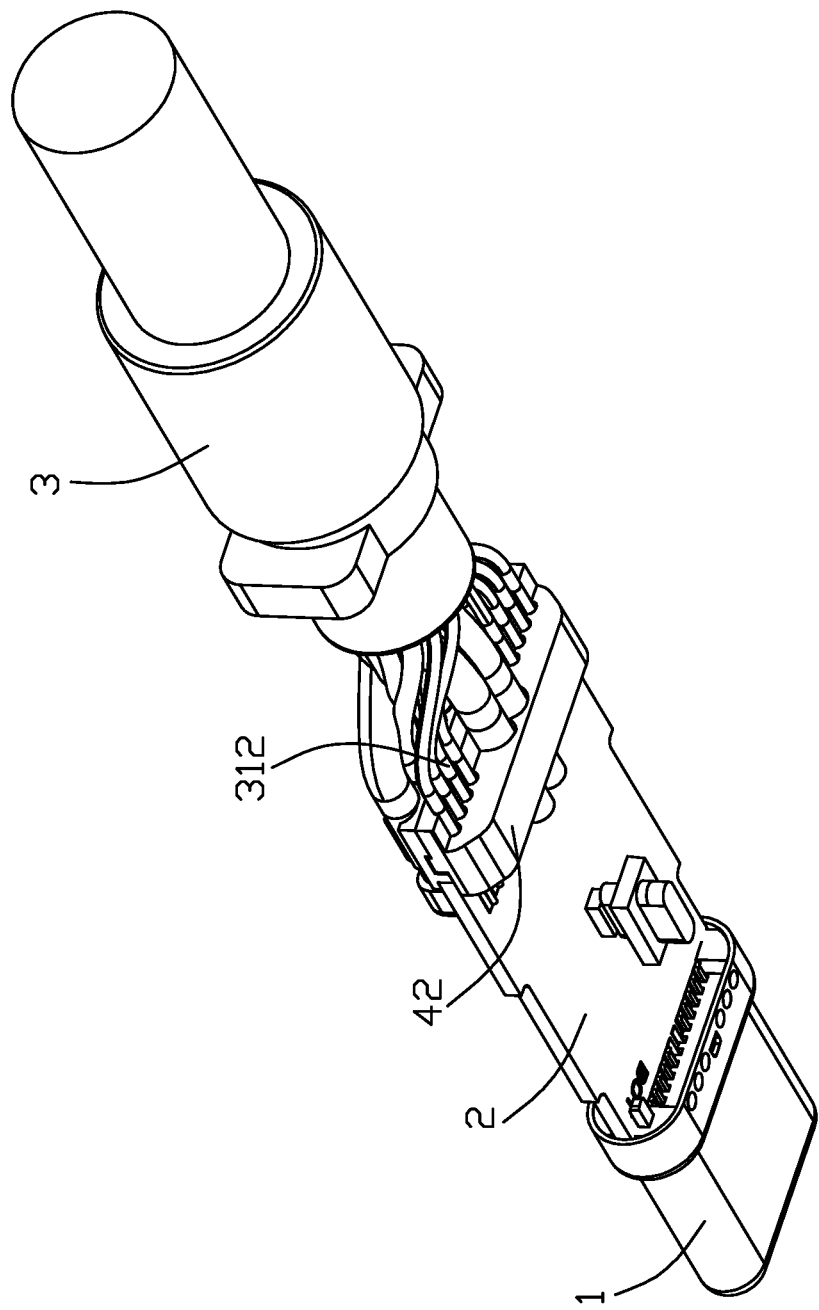
FIG. 11 is an another perspective view of the assembly structure of the plug connector assembly when welded as shown in FIG. 4.

Referring to FIG. 10, the inner conductor 3113 of the upper row of core wires 311 after soldering is soldered to the corresponding first conductive pad 221, the metal braid layer 3115 is soldered to the connecting portion 2222, and the grounding conductor 3117 and the grounding portion 2221 are soldered. The metal braid layer 3115 and the ground conductor 3117 are electrically connected by soldering.

The first portion 41 of the wire management block 4 of the plug connector assembly 100 of the present invention is equipped with the clamping slot 414 of the grounding core wire 3112 extending upwardly through the top surface of the first portion 41, so that the grounding core wire 3112 can be separated from the high-speed signal core wire 3111 and assembled separately in a later time. At the same time, since the clamping slot 414 is in the shape of a semi-arc groove, the strength of the wire management block 4 can be enhanced compared to the large-diameter hole-shaped fixing hole in the prior art. When the high-speed signal core 3111 is processed during soldering, the grounding core 3112 may not be installed within the management block 4, so the structural interference of the grounding core 3112 to the high-speed signal core 3111 may be eliminated, Therefore, the product yield of the plug connector assembly 100 of the present invention is increased, and assembly efficiency is improved.

What is claimed is:

1. A plug connector assembly comprising:
   a plug;
   a printed circuit board connected with the plug, the printed circuit board including a plurality of first conductive pads laterally arranged in a row and one or more second conductive pads extending laterally on a rear side of the first conductive pads;
   a wire management block having a plurality of first fixing holes; and
   a cable electrically connected with the printed circuit board, the cable including a plurality of first core wires and a plurality of second core wires, the first core wire including a first inner conductor and a shielding layer covering the first inner conductor, the second core wire including a second inner conductor, the first core wire being mounted to the plurality of first fixing holes of the wire management block while exposing the first inner conductor and the shielding layer to a front side of the wire management block, wherein
   the wire management block is provided with a plurality of clamping slots, the clamping slots running through the wire management block in a front-to-back direction, each clamping slot has an opening for placing a corresponding second core wire therein along a direction substantially perpendicular to the front-to-back direction, the second core wire is clamped in the clamping slot and exposes the second inner conductor to the front side of the wire management block, the first inner conductors of the first core wires are arranged in a row and soldered to the first conductive pads of the printed circuit board at one time, the second inner conductors of the second core wires and the shielding layers of the first core wires are arranged in a row and soldered to the one or more second conductive pads of the printed circuit board at one time.

2. The plug connector assembly as claimed in claim 1, wherein the clamping slots are disposed at a lateral outer side of the first fixing holes.

3. The plug connector assembly as claimed in claim 1, wherein a radius of a cross section of the second core wire is greater than a radius of a cross section of the first core wire.

4. The plug connector assembly as claimed in claim 3, wherein a lateral span of the one or more second conductive pads is greater than a lateral span of the plurality of first conductive pads.

5. The plug connector assembly as claimed in claim 4, wherein the second inner conductors of the second core wires and the shielding layers of the first core wires are connected to each other by a tin strip.

6. The plug connector assembly as claimed in claim 1, wherein the wire management block includes a first portion and a second portion engaged to the first portion.

7. The plug connector assembly as claimed in claim 6, wherein the clamping slot exposes upward through an upper side of the first portion.

8. The plug connector assembly as claimed in claim 7, wherein the first portion and the second portion are combined to form a stepped positioning portion for receiving a rear end of the printed circuit board.

9. A method of manufacturing a plug connector assembly, comprising the steps of:
   processing first core wires to expose respective inner conductors and shielding layers thereof;
   fixing the first core wire to a wire management block and positioning the exposed shielding layer and the inner conductor on a front side of the wire management block;
   processing a second core wire to expose an inner conductor thereof;
   engaging the second core wire into a fixing hole of the wire management block and arranging the inner conductor of the second core wire beside the shielding layers of the first core wires;
   soldering the inner conductors of the first core wires to corresponding first conductive pads of a printed circuit board at a first stage; and
   soldering the inner conductor of the second core wire and the shield layers to corresponding second conductive pads of the printed circuit board at a second stage after the first stage; wherein
   the fixing hole is essentially an open type clamping slot to communicate with an exterior in a vertical direction so that the second core wire is retained in the fixing hole only after the first stage and before the second stage for not only not hindering soldering the inner conductor of the first core wires to the first conductive pads during the first stage but also stably holding the second core wire in position during the second stage.

10. A plug connector assembly comprising:
    a housing;
    a printed circuit board received in the housing, the printed circuit board including first conductive pads laterally arranged in a row in a transverse direction, and one or more second conductive pads arranged in another row in the transverse direction, and located behind the first conductive pads in a front-to-back direction perpendicular to the transverse direction;
    a wire management block; and
    a cable electrically connected with the printed circuit board, the cable including a plurality of first core wires and a plurality of second core wires, each of said first core wires including a first inner conductor and a shielding layer surrounding the first inner conductor, each of the second core wires including a second inner conductor, each of the first core wires being mounted to the wire management block while exposing the first inner conductor and the shielding layer at a front side of the wire management block, wherein
    the wire management block is provided with a plurality of clamping slots, the clamping slots run through the wire management block along the front-to-back direction, each of the second core wires is clamped in the corresponding clamping slot and exposes the second inner conductor at the front side of the wire management block, the first inner conductors of the first core wires are arranged in a row and soldered to the first conductive pads of the printed circuit board via a first soldering strip, and the second inner conductors of the second core wires and the shielding layers of the first core wires are arranged in another row and soldered to the one or more second conductive pads of the printed circuit board via a second soldering strip.

11. The plug connector assembly as claimed in claim 10, wherein each of the clamping slots communicates with an exterior in a direction perpendicular to the front-to-back direction so as to allow the corresponding second core wire to be assembled thereinto in said direction.

12. The plug connector assembly as claimed in claim 11, wherein each of said second core wires is diametrically larger than each of said first core wires.

13. The plug connector assembly as claimed in claim 12, wherein said wire management block includes a plurality of fixing holes communicating with the exterior along the front-to-back direction only to receive the corresponding first core wires, respectively.

14. The plug connector assembly as claimed in claim 13, wherein said clamping slots are located by two opposite sides of the fixing holes in the transverse direction.

15. The plug connector assembly as claimed in claim 11, wherein said direction is a vertical direction perpendicular to both the front-to-back direction and said transverse direction.

16. The plug connector assembly as claimed in claim 10, wherein the second soldering strip is longer than the first soldering strip in the transverse direction.

* * * * *